(12) United States Patent
Sminia et al.

(10) Patent No.: US 10,602,609 B2
(45) Date of Patent: Mar. 24, 2020

(54) FLEXIBLE ELECTRICAL CONDUCTOR DEVICE

(71) Applicant: ALT Technologies B.V., Utrecht (NL)

(72) Inventors: Jelmer Douwe Sminia, Utrecht (NL); Ingmar Cees Johannes Van Der Linden, Utrecht (NL)

(73) Assignee: ALT Technologies B.V., Utrecht (NL)

( * ) Notice: Subject to any disclaimer, the term of this patent is extended or adjusted under 35 U.S.C. 154(b) by 350 days.

(21) Appl. No.: 14/723,589

(22) Filed: May 28, 2015

(65) Prior Publication Data
US 2016/0183359 A1    Jun. 23, 2016

(30) Foreign Application Priority Data
Dec. 22, 2014 (DE) .................... 20 2014 010 162 U

(51) Int. Cl.
*H05K 1/02* (2006.01)
*H05B 3/34* (2006.01)
(Continued)

(52) U.S. Cl.
CPC ........... *H05K 1/028* (2013.01); *B60N 2/5678* (2013.01); *B60N 2/5685* (2013.01); *B60N 3/04* (2013.01); *F21V 23/002* (2013.01); *H05B 3/12* (2013.01); *H05B 3/145* (2013.01); *H05B 3/34* (2013.01); *H05B 3/342* (2013.01); *H05K 1/0313* (2013.01); *H05K 1/09* (2013.01); *H05K 1/118* (2013.01); *F21Y 2115/10* (2016.08); *H05B 2203/003* (2013.01); *H05B 2203/013* (2013.01); *H05B 2203/016* (2013.01); *H05B 2203/029* (2013.01); *H05K 2201/0145* (2013.01); *H05K 2201/0154* (2013.01); *H05K 2201/09063* (2013.01)

(58) Field of Classification Search
CPC ...... B60N 2/5678; B60N 2/5685; B60N 3/04; F21V 23/002; F21Y 2115/10; H05B 2203/003; H05B 2203/013; H05B 2203/016; H05B 2203/029; H05B 3/12; H05B 3/145; H05B 3/34; H05B 3/342; H05K 1/028
USPC ....... 219/202, 549, 528, 203, 211, 212, 529, 219/541, 542, 543, 552, 553, 217, 219, 219/545, 548; 362/249.02, 382; 174/252; 338/208, 330, 331, 325, 254, 338/255
See application file for complete search history.

(56) References Cited

U.S. PATENT DOCUMENTS 6,193,365 B1 * 2/2001 Ikezaki ................ B41J 2/17513
219/543
7,268,325 B1 * 9/2007 Chuang .................... H01C 3/12
219/202

(Continued)

FOREIGN PATENT DOCUMENTS

EP    2062771 A1    5/2009
TW    374539 U1 *  11/1999

*Primary Examiner* — Dana Ross
*Assistant Examiner* — Ket D Dang
(74) *Attorney, Agent, or Firm* — N.V. Nederlandsch Octrooibureau; Catherine A. Shultz; Katelyn J. Bernier

(57) ABSTRACT

A flexible conductor device (1) includes an electrically insulating flexible carrier substrate (2) and a printed electrical conductor (12) situated on the flexible carrier substrate. The electrical conductor is defined by at least one elongate circuit (3) which extends between opposite ends (6). The carrier substrate (2) is provided with at least an incision or cut-out (4) extending through the full thickness of the carrier substrate (2) so as to provide enhanced flexibility.

18 Claims, 2 Drawing Sheets

(51) Int. Cl.

| | |
|---|---|
| *H05B 3/14* | (2006.01) |
| *H05K 1/11* | (2006.01) |
| *H05B 3/12* | (2006.01) |
| *B60N 2/56* | (2006.01) |
| *B60N 3/04* | (2006.01) |
| *F21V 23/00* | (2015.01) |
| *H05K 1/03* | (2006.01) |
| *H05K 1/09* | (2006.01) |
| *F21Y 115/10* | (2016.01) |

(56) References Cited

U.S. PATENT DOCUMENTS

| | | | |
|---|---|---|---|
| 7,777,156 B2* | 8/2010 | Rock | A41D 31/0038 |
| | | | 219/211 |
| 2003/0183620 A1* | 10/2003 | Wong | H05B 3/34 |
| | | | 219/549 |
| 2006/0231547 A1* | 10/2006 | Ferguson | A01M 1/2077 |
| | | | 219/529 |
| 2006/0289472 A1* | 12/2006 | Beisser | F24D 13/02 |
| | | | 219/541 |
| 2007/0056957 A1* | 3/2007 | Diemer | B60N 2/5685 |
| | | | 219/549 |
| 2007/0108190 A1* | 5/2007 | Ferguson | A61F 7/007 |
| | | | 219/545 |
| 2012/0044686 A1* | 2/2012 | Yang | F21V 15/00 |
| | | | 362/249.02 |
| 2013/0106147 A1* | 5/2013 | Lazanja | B60N 2/5685 |
| | | | 297/180.12 |

* cited by examiner

FLEXIBLE ELECTRICAL CONDUCTOR DEVICE

FIELD OF THE INVENTION

The invention is related to flexible conductor device, comprising an electrically insulating flexible carrier substrate and an electrical conductor situated on said flexible carrier substrate, wherein the electrical conductor is defined by at least one elongate circuit which extends between opposite ends.

BACKGROUND OF THE INVENTION

A flexible conductor device of this type is disclosed in EP-A-2062771. Said flexible conductor device is part of a vehicle seat heating system. By providing an electric current at the connectors located at the opposite ends of the circuit, a heating effect is obtained. The circuit has a shape comprising multiple serpentines so as to cover the surface of the vehicle seat.

The flexible conductor device is covered with an isolating foil and is incorporated in the seating surface of the vehicle seat. The vehicle seat in question has to satisfy the usual parameters which guarantee the comfort for the occupant, such as in particular a comfortable feel of the seating surface. In this connection, the addition of a conductor device, albeit this is flexible, may influence the seating comfort. For instance, the adaptability of the seating surface to the contours of the human body may be impaired thereby. This is caused by the local thickness differences which occur as a result of the serpentine circuit of the flexible conductor device. The incorporation of the flexible conductor device in vehicle interior parts with a higher stiffness and/or lower thickness than a vehicle seat may cause an even stronger discomfort.

Furthermore, as a result of the deformations experienced by the flexible conductor device, it may generate noises or a cracking sound which are to be attributed to characteristics of the carrier substrate. Also, the closed character of the prior art flexible conductor device has the disadvantage of inhibiting the circulation of air. Thereby the moisture regulation of e.g. a vehicle seat is impaired, which diminishes the comfort.

SUMMARY OF THE INVENTION

An object of the invention is therefore to provide a flexible conductor device of the aforementioned type which has a higher adaptability to deformations such as caused by forces executed through the human body. A further object is to provide a flexible conductor device which is less prone to generating undesirable noises upon deformation. Another object is to provide a flexible conductor device which allows an improved moisture and/or air regulation. These and other objects are obtained in that the carrier substrate is provided with at least an incision or cut-out extending through the full thickness of the carrier substrate. The incision or cut-out thus opens out at both surfaces of the carrier substrate which face away from each other. The incision or cut-out thereby separates the adjoining parts of the carrier substrate from each other, although these parts are still connected to each other outside the location of the incision or cut-out. As a result, these parts have a greater degree of movement or deformation with respect to each other.

The flexible electrical carrier substrate is able to deform under external loadings, not only as a result of the flexible character of its constituent material, but also as a result of the geometrical modification of its overall shape. In fact, the material of the substrate being flexible allows it to deform in bending and to a limited extend in stretching. Additionally however, the presence of incisions or cut-outs allow for even larger deformations as the parts of the substrate bordering these incisions or cut-outs allow a greater degree of mutual movements towards and away from each other. Thereby, the overall flexibility of the flexible electrical carrier substrate is enhanced appreciably. Moreover the generation of undesirable sounds upon deformation thereof are mitigated or even completely avoided.

Preferably, in the case of cut-outs, an open area of at least 30%, preferably at least 40%, more preferably at least 50% and most preferably to at least 60% in relation to the full area as defined by the outer circumference of the flexible carrier substrate is obtained in the flexible conductor device. Thus, a desired ventilation capacity and moisture regulation van be ascertained. Preferably, the lengths of the elongate electrical circuits are about equal.

The incisions or cut-outs may have any desirable shape; in general however the incisions or cut-outs may follow, or extend essentially parallel to, at least part of a circuit. Preferable, the electrical conductor comprises at least two parallel circuits in which case the at least one incision or cut-out may be located between said parallel circuits. More preferably, the at least one incision or cut-out extends parallel to the full length of a circuit.

At least part of the circuit may be bordered on opposite sides by an incision or cut-out. In particular, the distance between the incisions or cut-outs located on opposite sides of a circuit is about two to four times the width of said circuit. In such embodiment, the flexible carrier substrate is generally reduced to the area defined by the course, for instance a serpentine course, of the electrical conductor.

The flexible carrier substrate may comprise several kinds of flexible materials, such as PET (polyethyleneterephtalate), PEI (polyethylenenaphtalate) or PI (polyimid) material. Other plastics are also possible, such as polypropylene, polyethylene. The electrical conductor may comprise e.g. a copper, silver or carbon circuit. The electrical conductor may be obtained in several ways. For instance, the conductor may be obtained by means of an etching process which is well-known per se. Also, it is possible to obtain the electrical conductor through a deposition process. Alternatively, the conductor may be obtained by means of a printing process, which is well-known as well, using copper, silver, aluminium or carbon paste or hybrid ink. The electrical conductor is thus laminated on the flexible carrier substrate.

Preferably, the thickness of the flexible carrier substrate ranges from 10 µm to 2 mm. More preferably, the thickness of the substrate ranges from 50 µm to 100 µm. Preferably, the thickness of the electrical conductor is in the range of 2-75 µm. Further preferably, the electrical conductor may be strip-shaped. The length of a circuit as measured between the opposite ends thereof is several orders of magnitude larger than the width thereof. Furthermore, an incision or cut-out may be isolated from the circumference of the flexible carrier substrate. In other words, the incision or cut-out is located somewhere in the middle of the carrier substrate without emanating at the borders thereof. Nevertheless, it is also possible to apply incisions or cut-outs which do emanate at the border of the carrier substrate.

The flexible conductor device may applied for several purposes. According to a first possibility, the flexible conductor device may be incorporated in a flexible heating device, whereby electrical connectors are provided at the opposite ends of the circuit(s) for supplying electrical current to the flexible conductor device. In case the lengths of the elongate electrical circuits are about equal, a uniform heating of the device is ascertained. The electrical conductor then serves as a heating element, and to that end has a resistive character.

Such heating device may be used to heat interior components of a vehicle, such as an armrest, a seat, a floor mat, a midconsole, a roof, a steering wheel, a side panel. The interior component may comprise a cover layer, such as a leather layer, a flexible heating device as described before and located beneath the cover layer, wherein the circuit is situated between the leather layer and the flexible carrier substrate, and a support layer, such as a foam layer, located beneath the flexible heating device.

A further possible application of the flexible conductor device is related to flexible lighting devices. In the case of such lighting devices, electrical connectors are provided at the opposite ends of the circuit(s) for supplying electrical current to the flexible conductor device, and lighting means connected to the electrical circuit. The lighting means may comprise several electrical light sources, such as LED's, which are arranged in series or parallel.

BRIEF DESCRIPTION OF THE DRAWINGS

The invention will now be described further with reference to an embodiment of a heater device as shown in the drawings.

DETAILED DESCRIPTION OF THE INVENTION

Figure 1:
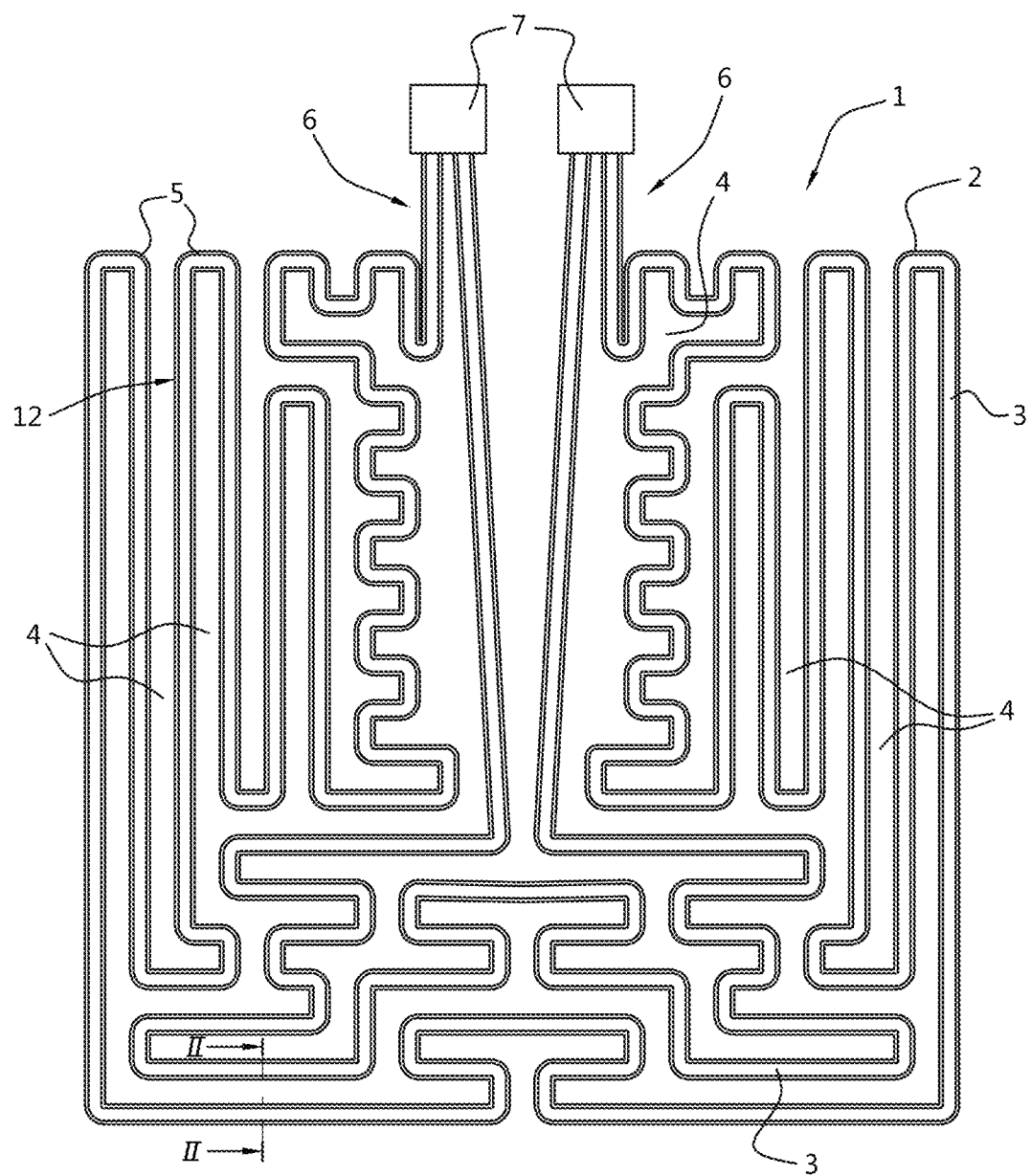
FIG. 1 shows a view of a flexible conductor device.
Figure 2:
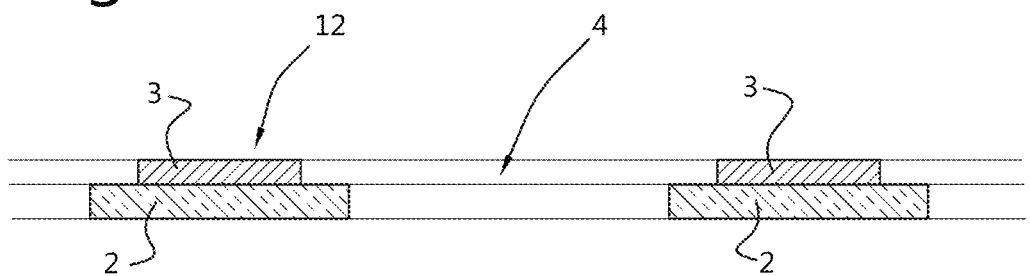
FIG. 2 shows the cross-section according to II-II of FIG. 1.

The flexible conductor device 1 as shown in FIGS. 1 and 2 has a flexible carrier substrate 2 of an electrical insulating foil onto which an electrical conductor 12 comprising a number of circuits in the form of copper conductor strips 3 has been printed. The flexible carrier substrate 2 has a number of cut-outs 4 which in this embodiment delineate the copper conductor strips 3. In particular, as a result of the specific shape of the cut-outs, the flexible carrier substrate 2 appears to have been transformed into a number of foil strips 5 which generally follow the trajectory of the copper conductor strips 3.

The flexible conductor device 1 has been obtained by first of all printing the copper conductor strips 3 onto the flexible carrier substrate 2. Subsequently, the flexible carrier substrate is cut out, e.g. by a suitably shaped punching device, so as to obtain the cut-outs 4 shown. The printing process may be carried out by etching, or by printing of a copper-paste, which techniques are well-known in the field of electronics.

The flexible conductor device 1 may be used in a heating device, for which purpose the several copper circuits 3 at their opposite ends 6 are provided with a respective electrical connector 7. The copper circuits are thus acting as a resistor and form a heating element. Upon applying an electric current to these connectors 7, the copper circuits are raised in temperature so as to provide a heating effect. In case the length of the several copper circuits 3 is about equal, and in view of the regular distribution of the copper circuits 3 over the complete area covered by the flexible electrical conductor device 1, a uniform heating effect can be ascertained.

Figure 3:
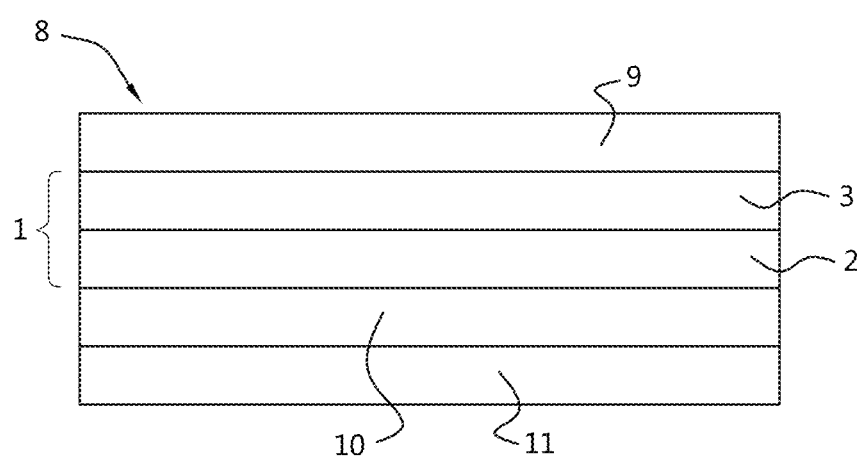
FIG. 3 shows a schematic section of a car interior element.

FIG. 3 shows a section through a vehicle interior component 8 which has been provided with the flexible conductor device 1 as shown in FIG. 1. The vehicle interior component, such as an armrest, vehicle seat or steering wheel, has an cover layer 9 of e.g. leather which is in contact with the occupant of the vehicle. This cover layer 9 is directly applied on top of the flexible conductor device 1, and is in contact with the copper circuits 3 thereof. Thus, a direct and efficient heating of the outer layer is obtained. Furthermore, the cover 9 layer has still a comfortable feel. This is due to the thin character of the copper circuits 3 which hardly lead to unevenness aspects in the outer surface of the cover layer 9.

Furthermore, the comfortable feel of the cover layer 9 can be maintained as a result of the enhanced flexibility of the flexible conductor device 1. The incisions or cut-outs 4 thereof allow it to be conformed to the shape of the vehicle interior part, and in the case of a vehicle seat allow it to be deformed under the influence of the forces exerted by the occupant. For instance, the flexible conductor device 1 can be adhered to the foam layer 11 of a vehicle seat by means of an adhesive 10.

LIST OF REFERENCE NUMERALS

1. Flexible conductor device
2. Flexible carrier substrate
3. Circuit or strip
4. Cut-out
5. Strip of flexible carrier substrate material
6. End of circuit
7. Connector
8. Vehicle interior component
9. Cover layer
10. Adhesive layer
11. Foam layer
12. Electrical conductor

The invention claimed is:

1. A flexible conductor device, comprising an electrically insulating flexible carrier substrate and an electrical conductor arranged on said electrically insulating flexible carrier substrate, wherein the electrical conductor is defined by at least one circuit which forms a meandering trajectory extending between opposite circuit terminals, wherein said electrically insulating flexible carrier substrate is provided with at least two cut-outs, said cut-outs extending through a full thickness of said electrically insulating flexible carrier substrate, wherein said cut-outs are located outside an area of said electrically insulating flexible carrier substrate where the electrical conductor is arranged, wherein said cut-outs delineate edges of said electrically insulating flexible carrier substrate, said edges bordering on both opposite lateral edges of said circuit so that said electrically insulating flexible carrier substrate forms strips that follow said circuit along said meandering trajectory.

2. The flexible conductor device according to claim 1, wherein the electrical conductor comprises two circuits that are connected in parallel, and wherein said cut-outs include one interposed cut-out that is located between said two circuits connected in parallel, wherein said interposed cut-out delineates a first edge of said electrically insulating flexible carrier substrate that borders on a first lateral edge of a first one of said two circuits, and delineates a second edge of said electrically insulating flexible carrier substrate that borders on a second lateral edge of a second one of said two circuits, so that the interposed cut-out is enclosed by said two circuits and separates said two circuits.

3. The flexible conductor device according to claim 2, wherein said two circuits connected in parallel have the opposite ends in common.

4. The flexible conductor device according to claim 1, wherein the at least one of said cut-outs extends parallel to a full length of said at least one circuit.

5. The flexible conductor device according to claim 1, wherein a distance between the cut-outs located on opposite sides of said at least one circuit is about two to four times a width of said at least one circuit.

6. The flexible conductor device according to claim 1, wherein said electrically insulating flexible carrier substrate comprises polyethylene terephthalate, polyethylene naphthalate, or polyimide material.

7. The flexible conductor device according to claim 1, wherein the electrical conductor comprises a copper, silver or carbon circuit.

8. The flexible conductor device according to claim 1, wherein the thickness of said electrically insulating flexible carrier substrate is in a range of 10 μm-2 mm.

9. The flexible conductor device according to claim 1, wherein a thickness of the electrical conductor is in a range of 2 μm-75 μm.

10. The flexible conductor device according to claim 1, wherein the electrical conductor is strip-shaped.

11. The flexible conductor device according to claim 1, wherein a length of said at least one circuit as measured between the opposite ends thereof is several orders of magnitude larger than a width thereof.

12. The flexible conductor device according to claim 1, wherein at least one of said cut-outs is isolated from an outer circumference of said electrically insulating flexible carrier substrate.

13. The flexible conductor device according to claim 1, wherein an open area as defined by the at least one cut-out, in relation to the area of said electrically insulating flexible carrier substrate amounts to at least 30%.

14. The flexible conductor device according to claim 1, wherein the at least one circuit comprises a first circuit and a second circuit, and wherein lengths of said first circuit and second circuit are about equal.

15. A flexible heating device, comprising a flexible conductor device according to claim 1, and electrical connectors at the opposite ends of the at least one circuit of the flexible conductor device for supplying electrical current to the flexible conductor device.

16. A heatable interior component of a vehicle, comprising a cover layer, a flexible heating device according to claim 15 located beneath the cover layer, wherein the at least one circuit is situated between the cover layer and said electrically insulating flexible carrier substrate, and a support layer, located beneath the flexible heating device.

17. A flexible lighting device, comprising a flexible conductor device according to claim 1, electrical connectors at the opposite ends of the at least one circuit of the flexible conductor device for supplying electrical current to the flexible conductor device, and at least one electrical light source connected to the flexible conductor device.

18. The flexible lighting device according to claim 17, wherein the at least one electrical light source comprises several electrical light sources, which are arranged in series or parallel.

\* \* \* \* \*